United States Patent [19]

Cynkar et al.

[11] 4,415,606
[45] Nov. 15, 1983

[54] METHOD OF REWORKING UPPER METAL IN MULTILAYER METAL INTEGRATED CIRCUITS

[75] Inventors: Thomas E. Cynkar, Centerville; James G. House, Kettering, both of Ohio

[73] Assignee: NCR Corporation, Dayton, Ohio

[21] Appl. No.: 456,689

[22] Filed: Jan. 10, 1983

[51] Int. Cl.³ .......................... C23F 1/02; B44C 1/22; B05D 5/12; C03C 15/00
[52] U.S. Cl. .................................... 427/90; 29/591; 156/643; 156/651; 156/656; 156/659.1; 204/192 EC; 204/192 E; 252/79.4; 357/71; 427/91; 430/316; 430/318
[58] Field of Search .................... 204/192 EC, 192 E; 427/88–91; 156/643, 644, 650, 651, 652, 653, 656, 657, 659.1, 661.1; 252/79.3, 79.2, 79.4; 29/591; 357/71; 430/312, 313, 315, 316, 317, 318, 329

[56] References Cited

U.S. PATENT DOCUMENTS 3,856,648  12/1974  Fuller et al. ................ 204/192 EC
4,076,575  2/1978   Chang ......................... 156/656
4,184,909  1/1980   Chang et al. .................. 156/643
4,336,295  6/1982   Smith ....................... 156/651 X Primary Examiner—William A. Powell
Attorney, Agent, or Firm—J. T. Cavender; Philip A. Dalton; Casimer K. Salys

[57] ABSTRACT

A process for reworking the upper level metal layer of an integrated circuit wafer having multiple levels of metal connected by vias through intermediate dielectric layers. In one form, a photoresist masking layer is first formed over the defective upper level metal using an expanded reverse field pattern of the vias. The wafer is then subjected to a metal etch to completely remove the exposed upper level metal while etching into the metal under the photoresist until the etching enters the metal in the via. Thereafter, the residual photoresist is removed. The rework process is concluded with a single chamber operation composed of a sputter etch followed by the deposition of new upper level metal. The concluding chamber sequence ensures the proper via metal surface conditioning for reliable deposition bonding of the new upper level metal deposited thereon.

4 Claims, 7 Drawing Figures

METHOD OF REWORKING UPPER METAL IN MULTILAYER METAL INTEGRATED CIRCUITS

BRIEF SUMMARY

The present invention relates to a process for reworking an upper level metal layer on a semiconductor wafer having multiple metal layers electrically interconnected by interlevel vias through intermediate dielectric layers. The process allows defective upper level metal patterns to be removed without damaging the lower level metal patterns at the via, so that the replaced upper level metal layer bonds effectively and reliably to the lower level through the original via.

In one form, the process is implemented by photolithographically processing a photoresist layer deposited over the defective upper level metal to mask each via. The masking photoresist patterns are dimensionally adjusted to compensate for underetching at the perimeters of each via. With the mask in place, the wafer is first subjected to a metal etch, and then followed with a brief silicon and oxide etch operation. Thereafter, the photoresist mask is removed and the wafer is subjected to a sputter etch and, in direct succession in a single chamber operation, the deposition of a new upper level metal layer. With the new upper level metal in place, the wafer is returned to normal processing.

The use of a process which utilizes controlled masking to minimize step formations, together with a sputter etch and a metal deposition in a single, unified chamber operation, produces rework vias which replicate the originals in terms of overall yield and resistance characteristics. These and other features inherent in the invention will be described with greater particularity during the ensuing development of the preferred embodiment.

DETAILED DESCRIPTION

The development of semiconductor devices and the processes by which they are fabricated has been the subject of substantial growth in recent years. As a result, there has been a significant increase in component density and circuit complexity. The density of active and passive integrated circuit devices has grown not only by direct reductions in size, but by the utilization of multiple conductive layers to create and control closely adjacent devices. With a growing emphasis on speed, there is a concurrent trend toward the use of metal alloy composition conductors, as opposed to conductively doped polycrystalline silicon materials. Interlayer connections among the various conductive layers, through intermediate dielectric layers, are normally created by passages commonly known as vias.

It is no doubt appreciated that a wafer undergoing fabrication acquires substantial value as it reaches the latter stages of processing. Consequently, it would be of particular value to devise a process by which defects introduced in a layer formed late in the fabrication cycle could be corrected without degrading general yield or introducing expensive additional rework process operations.

In this regard, the present invention addresses the replacement of defective upper level metal layers in a wafer having multiple metal layers, where the upper level metal is joined to one or more lower level metals through vias. Heretofore, the direct etching of the upper level metal also resulted in etching into the lower level metal at the vias by virtue of the necessary overetching to completely clear the wafer of upper level metal. The damage to the lower level metal commonly appeared as pitting or undercutting at the bottom of the vias. The electrical connections between subsequently deposited metal layers and the etch-damaged lower level metals, through the vias, consistently resulted in unacceptably low yields and reliability levels.

A different approach to correcting defects in the upper level metal is described in U.S. Pat. No. 4,259,367. Though the process is in some ways suited to automation, the addition of layers, vias, and highly particularized masking operations are not suitable for applications requiring the rework of moderately valued wafers.

The process according to the present invention addresses the problem of reworking the upper level metal by using a photoresist mask which can be generated in substantially automatic fashion and a sequence of additional process operations which can be readily implemented with conventional fabrication equipment and techniques.

Figure 1:
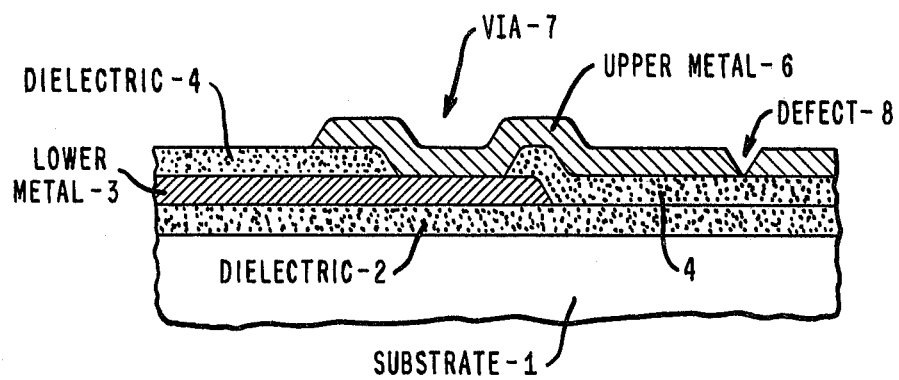
FIG. 1 is a cross-sectional schematic of an integrated circuit wafer segment in the area of the intermetal via.

To understand the process, described by way of a preferred embodiment, attention is now directed to the cross-section of a wafer segment shown schematically in FIG. 1. FIG. 1 depicts a semiconductor base 1, such as a monocrystalline silicon substrate or epitaxial layer, covered by dielectric layer 2 of silicon dioxide (oxide). According to the embodiment, dielectric 2 has formed on one side thereof a lower level metal 3, composed of an aluminum alloy containing approximately 1% silicon and 0.5–4% copper by volume. The nominal thickness of lower level metal 3 is 10,000 Angstroms. As shown in FIG. 1, lower level 3 and dielectric 2 are themselves covered with intermetal dielectric 4, composed of chemical vapor deposition (CVD) oxide to a nominal thickness of 11,000 Angstroms. Patterned upper level metal 6, of the aforementioned composition, is shown over intermetal dielectric 4, making contact with lower level metal 3 at via 7. A generalized defect is shown at 8.

It is no doubt apparent that the number of layers beneath lower metal 3, or the number of layers to be formed over upper metal 6 is of little consequence, since the objective is to replace upper level metal 6 without losing the electrically conductive path through via 7. Furthermore, though via 7 is shown to pass through single dielectric layer 4, it is fully contemplated that via can project through a plurality of intermediate layers. Note, that for the present embodiment the etchant utilized to remove upper level metal 6 must perform this operation without materially attacking dielectric layer 4. On the whole, however, this choice is substantially identical to that made in selecting the etchant to pattern upper level metal 6.

The preferred rework procedure is delineated by summary in Table I, with the physical effects on the structure of FIG. 1 illustrated in the sequence of FIGS. 2-5.

TABLE I (A) Clean wafer with acetone, alcohol, and 15 minutes in asher.
(B) Deposit photoresist and soft bake.
(C) Expose wafer using expanded-side lightfield mask of vias.
(D) Develop and hard bake.
(E) Descum for 90 seconds at 100 watts in asher.
(F) Metal etch for 7 minutes with a 16:1:1:2 composition of phosphoric acid:acetic acid:nitric acid:DI water at 32° C.
(G) Poly/oxide etch for 7 seconds with a 30:15:1 composition of acetic acid:nitric acid:hydrofluoric acid.
(H) Examine cleanliness of wafer with microscope (QC).
(I) Clean wafer with acetone, alcohol, and 15 minutes in asher.
(J) Premetal etch for 10 seconds in a 20:1 composition of buffered hydrofluoric acid.
(K) Sputter etch for 1 minute.
Retain chamber vacuum.
(L) Deposit new upper level metal.
(M) Return to normal processing.

Steps (A) and (B) in TABLE I are standard cleaning and photoresist deposition operations. In general, any commonly available photoresist exhibiting good adhesion to metal is suitable, though nominal adjustments may be required in mask dimensions for the differing photoresist characteristics.

It is with step (C) that the operations unique to the present rework process are introduced. The dark field mask formerly used to delineate vias, for the etching of dielectric 4 at via location 7, is regenerated as a lightfield (reverse field) mask of expanded via size. For the present embodiment, the via patterns on the lightfield masks are expanded by 2.5 microns on each side. This dimensional increase has shown to be suitable for the process conditions in TABLE I apply to vias formed with square or rectangular dark field mask patterns of at least 3 microns per side. The implementation of other dimensions will be developed hereinafter.

It will no doubt be recognized that conventional mask regeneration techniques are highly automated. Therefore, the cost and complexity of recreating the modified via masks is relatively nominal.

Step (C) prescribes an exposure of the photoresist using the lightfield mask described above, followed by the development and hard bake in step (D), and a 90 second descum operation in step (E).

Figure 2:
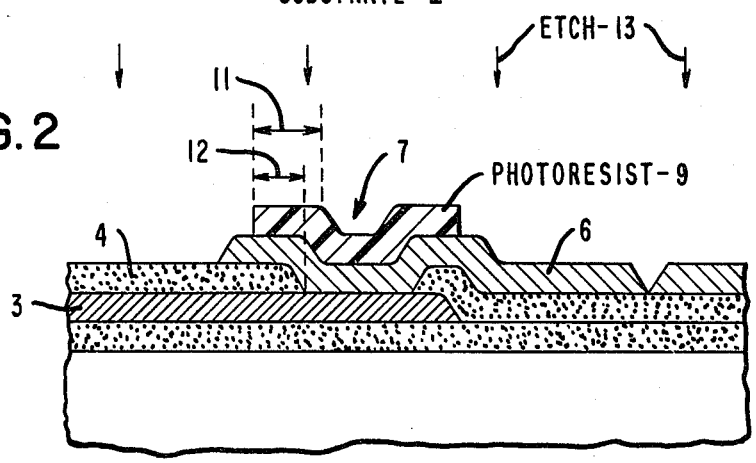
FIG. 2 illustrates the structure in FIG. 1 with patterned photoresist suitable to mask the via during etching of the defective upper level metal.

The structural cross-section at the conclusion of step (E) is depicted in FIG. 2. Patterned photoresist 9 covers via 7, and extends laterally by a dimension 11 in the range of 2.5 microns. Note that the actual opening in via 7 is greater than the via mask dimension, by virtue of commonly known lateral etching effects on oxide 4, to reduce the effective difference in size between photoresist 9 and via 7 at lower metal 3 to a dimension 12 of less than 2.5 microns.

Figure 3:
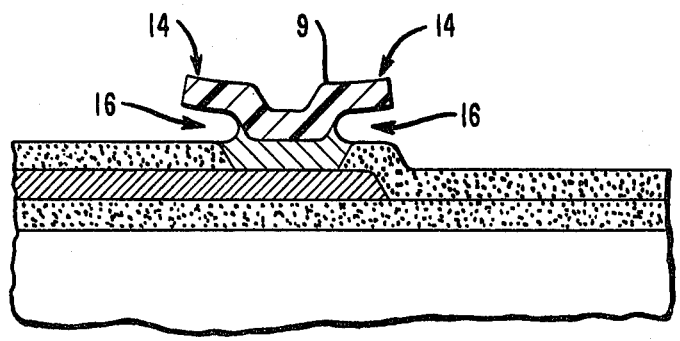
FIG. 3 depicts the structure of FIG. 2 at the conclusion of the metal etch sequence.

According to step (F) the wafer, with photoresist 9 in place, is subjected to metal etch 13 using a 16:1:1:2 etchant composition of phosphoric acid:acetic acid:nitric acid:deionized (DI) water at a temperature of 32° C. for a period of 7 minutes. Thereafter, a 7 second poly-/oxide etch with a 30:15:1 composition of acetic acid:nitric acid:hydrofluoric acid is employed to remove residual silicon based debris. As shown in the schematic of FIG. 3, photoresist 9 is subject to moderate curling at 14 and significant underetching into upper level metal 6 at 16, beneath photoresist 9, by virtue of the overetch period included in step (F). The use of less overetch or an anisotropic etch operation inherently requires adjustments in the dimensional increase described heretofore for photoresist mask 9.

Step (H) represents a commonly practiced QC examination to verify the effectiveness of the metal etch. Significant defects in the etch are visibly detectable. The cleaning of the wafer to remove masking photoresist follows in step (I) with acetone, alcohol and a 15 minute asher operation.

Figure 4:
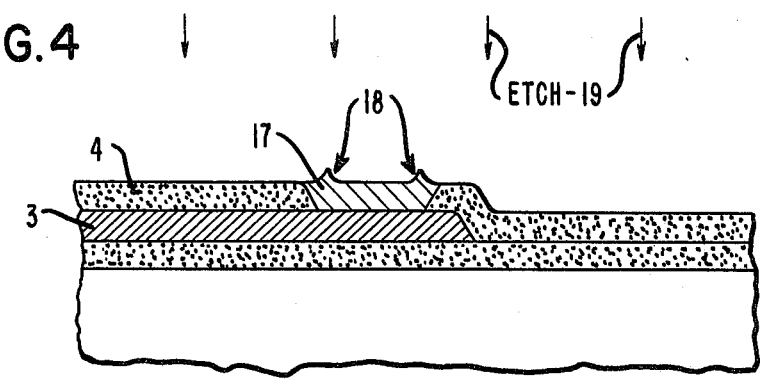
FIG. 4 shows a structure in FIG. 3 undergoing a sputter etch with the photoresist mask removed.
Figure 5:
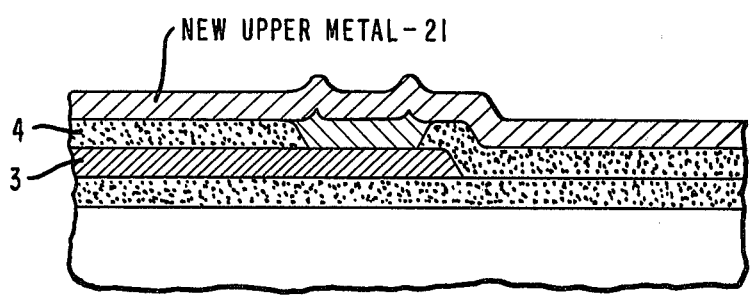
FIG. 5 shows the structure in FIG. 4 after the deposition of the new upper level metal.

At this point in the rework process, the wafer has the appearance depicted schematically in FIG. 4. Lower level metal 3 remains bonded to the residual upper level metal, via metal 17. The shape of the retained via metal, 17, form an upper surface on the wafer which is substantially flush with oxide 4. It is generally preferred that the size of the via mask, the nature of metal etch 13, and the duration of the overetch be selected to ensure that via metal 17 exhibits at least some upward projections, such as illustrated at 18, to ensure a consistent conductive path between via metal 17 and lower level metal 3. To obtain this result, upper level metal etching is generally terminated when the etch reaches the surface of the via recess in the dielectric 4.

Premetal etch step (J) using 20:1 buffered hydrofluoric acid removes oxide growth formed during the normal handing and storage of the wafers.

According to step (K) of the preferred process, the wafer structure shown in FIG. 4 is next subjected to sputter etch 19 at 1500 watts in argon gas for a duration of 1 minute, and without releasing the chamber vacuum, the wafer is then subjected to the metal deposition in step (L). This sequence forms a new upper level metal 21 to a thickness of approximately 10,000 Angstroms. Preferably, the same metal composition is utilized. The continuity between sputter etch 19, which conditions the exposed surface of via metal 17, and the immediately succeeding deposition of new upper level metal 21 ensures consistent and reliable bond therebetween.

Step (M) shows a return to the normal process at the point where the upper level metal is covered by photoresist for photolithographic processing and pattern etching.

In accomplishing the rework procedure described above by way of the preferred embodiment, it should be fully appreciated that a fabrication sequence which creates residual structural patterns, such as projections 18 in FIG. 4, is clearly preferred over a sequence during which upper level metal etch 13 (FIG. 2) is continued until via metal 17 is removed to a level below oxide layer 4. This preference relates to the duration of the etch and/or the size of photoresist mask 9 (FIG. 2). In this regard, note the perspective view of a contact as illustrated in FIG. 6, and redepicted by cross-section in FIG. 7.

Figure 6:
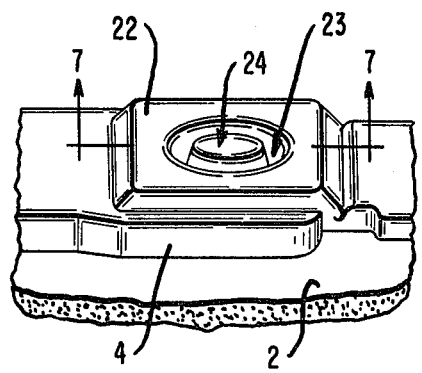
FIGS. 6 and 7 are respectively, perspective and cross-sectional views of the reworked via subject to a moderately excess etch of the old upper level metal.
Figure 7:
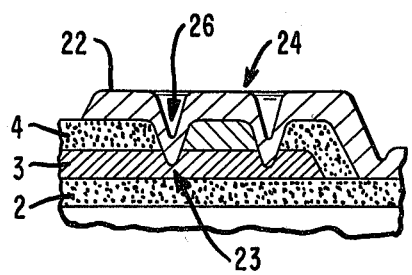

Though the overetching depicted in FIGS. 6 and 7 is significant, the residual of lower level metal 3 still ensures electrical continuity to new upper level metal 22. Note, however, that if the etch were continued much longer, the penetration of the etch at 23 would project completely through lower level metal 3 to dielectric 2. In that situation, the isolation of the via metal, in the form of the island at 24, would be complete. Given the tendency of upper level metal to thin out and overhang when deposited onto a structure having multilevel steps, diagrammatically depicted at location 26 in FIG. 7, it will not doubt be appreciated that the close proximity of the double step at 23 will often prevent reliable metal connection between new upper level metal 22 and lower level metal 3.

The lack of reliable contact between levels upon rework is frequently encountered with contacts formed from mask patterns dimensionally smaller than 3×3 microns. Though equipment design limitations are undoubtedly significant contributors to the lack of reliable rework for such small contacts, it cannot be overlooked that the size of the photoresist mask, or the degree of overetch, can have a significant impact on the formation of reliable electrical connections through the via.

One skilled in the art related to integrated circuit fabrication and rework will no doubt appreciate the unique and beneficial features inherent in the presently disclosed method of reworking upper level metal. The rework mask generation and size, the extent of etching the old upper level metal to retain prescribed via metal shapes, and the concluding operation of a sputter etch and the new upper level metal deposition in the single chamber process, are but some of the features which characterize the process. It should, therefore, be understood that each claim must be accorded individual breadth coextensive not only with the scope of the described embodiment, but with the full spirit of the invention features individually and in the combination.

We claim:

1. An upper level metal rework process for a multilevel metal integrated circuit wafer having multilevel metal conductors joined by vias through dielectric layers, comprising the steps of:

forming a photoresist mask layer over each metal via, said mask having a dimension nominally greater than said via;

etching the upper level metal with an etchant that does not materially etch the dielectric, until the etched region of the upper level metal just enters the recessed region of the via;

removing the masking photoresist;

sputter etching the wafer in an evacuated chamber; and depositing a new layer of upper level metal without exposing the sputter etched wafer to atmospheric ambients.

2. The process recited in claim 1, including the additional steps of:

etching the wafer briefly with a poly/oxide etchant; and etching the wafer briefly with a premetal etch of buffered hydrofluoric acid;

perform before said step of sputter etching.

3. The process recited in claim 2, wherein:

said greater dimension of said photoresist pattern and the thickness of the upper level metal are in a nominal proportion of 2.5:1;

said wafer metal is an aluminum alloy with small percentages of copper and silicon;

said metal etchant is a composition of phosphoric acid with significantly lesser proportions of acetic acid, nitric acid and DI water; and said poly/oxide etchant is a composition of acetic acid, a significantly lesser proportion of nitric acid, and a relatively small proportion of hydrofluoric acid, 4. The process recited in claim 3, wherein said step of forming a photoresist comprises the steps of:

forming a photolithographic reverse field mask of the via, with each peripheral dimension of the via pattern increased by an amount in the range of 2.5 times the upper level metal thickness;

coating the wafer with photoresist material; and exposing and developing the photoresist material.

* * * * *